US009941227B2

(12) United States Patent
Zhu et al.

(10) Patent No.: US 9,941,227 B2
(45) Date of Patent: Apr. 10, 2018

(54) IMPEDANCE MATCHING CONFIGURATION

(71) Applicant: Ampleon Netherlands B.V., Nijmegen (NL)

(72) Inventors: Yi Zhu, Nijmegen (NL); Josephus Van Der Zanden, Nijmegen (NL); Iouri Volokhine, Nijmegan (NL); Rob Mathijs Heeres, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 15/165,317

(22) Filed: May 26, 2016

(65) Prior Publication Data

US 2016/0351513 A1 Dec. 1, 2016

(30) Foreign Application Priority Data

May 27, 2015 (EP) ..................................... 15169491

(51) Int. Cl.
*H01L 23/66* (2006.01)
*H01L 23/48* (2006.01)
(Continued)

(52) U.S. Cl.
CPC .............. *H01L 23/66* (2013.01); *H01L 24/06* (2013.01); *H01L 24/49* (2013.01); *H03F 1/565* (2013.01); *H03F 3/195* (2013.01); *H01L 24/48* (2013.01); *H01L 2223/6611* (2013.01); *H01L 2223/6655* (2013.01); *H01L 2223/6666* (2013.01); *H01L 2223/6672* (2013.01); *H01L 2224/04042* (2013.01); *H01L 2224/05552* (2013.01); *H01L 2224/05553* (2013.01); *H01L 2224/4813* (2013.01); *H01L 2224/48091* (2013.01); *H01L 2224/48195* (2013.01); *H01L 2224/48227* (2013.01); *H01L 2224/49175* (2013.01); *H01L 2924/00014* (2013.01); *H01L 2924/1421* (2013.01); *H01L 2924/19011* (2013.01); *H01L 2924/19041* (2013.01);
(Continued)

(58) Field of Classification Search
CPC ...................................................... H01L 23/66
See application file for complete search history.

(56) References Cited

U.S. PATENT DOCUMENTS 6,396,342 B1 5/2002 Takenaka
2002/0097094 A1 7/2002 Wang et al.
(Continued)

FOREIGN PATENT DOCUMENTS

EP 2388815 A1 11/2011

OTHER PUBLICATIONS

European Search Report for EP 15 16 9494 dated Nov. 24, 2015.

*Primary Examiner* — Victor A Mandala
*Assistant Examiner* — Regan J Rundio
(74) *Attorney, Agent, or Firm* — McDonnell Boehnen Hulbert and Berghoff LLP

(57) ABSTRACT

A package is provided. The package comprises a die and an impedance matching network. The die has a first terminal and a second terminal. The impedance matching network is coupled to the second terminal and comprises a first inductor and a first capacitor. The first inductor comprises first bond wire connections coupled between the second terminal and a first bond pad on the die, and second bond wire connections coupled between the first bond pad and a second bond pad coupled to the first capacitor.

18 Claims, 10 Drawing Sheets

(51) Int. Cl.
*H03F 3/191* (2006.01)
*H03H 7/38* (2006.01)
*H01L 23/00* (2006.01)
*H03F 1/56* (2006.01)
*H03F 3/195* (2006.01)

(52) U.S. Cl.
CPC .............. *H01L 2924/19042* (2013.01); *H01L 2924/19104* (2013.01); *H01L 2924/19105* (2013.01); *H01L 2924/19107* (2013.01); *H01L 2924/30105* (2013.01); *H01L 2924/30107* (2013.01); *H01L 2924/30111* (2013.01); *H03F 2200/451* (2013.01)

(56) References Cited

U.S. PATENT DOCUMENTS

2009/0096068 A1* 4/2009 Sjoestroem ............ H01L 23/66
 257/666
2016/0344353 A1* 11/2016 Watts ...................... H01L 23/66

* cited by examiner

IMPEDANCE MATCHING CONFIGURATION

CROSS-REFERENCE TO RELATED APPLICATION

This application makes reference to and claims priority to European Patent Application Serial No. 15169491.6, filed 27 May 2015, entitled "Impedance Matching Configuration," which is incorporated herein by reference in its entirety.

FIELD OF THE INVENTION

The present disclosure relates to impedance matching and in particular the configuration of an impedance matching circuit.

BACKGROUND

A functional circuit, fabricated on an integrated circuit die, may benefit from impedance matching. Impedance matching may adjust an input and/or output impedance of the functional circuit in order to adjust characteristics of the circuit, for example power transfer or signal reflection. For example, in radio frequency (RF) systems, matching the input impedance of the inputs with the load impedance reduces the signal reflection. Functional circuits may therefore be designed with impedance matching circuits. These impedance matching circuits may be included in-package. In other words, an impedance matching circuit may be coupled to the die before packaging of the die. The leads of the resulting integrated circuit package may be internally coupled to the terminals of the die via the impedance matching circuitry included in the package.

Although an impedance matching circuit may be designed theoretically, the physical implementation of the impedance matching circuit can lead to the introduction of imperfections. For example, the physical implementation of impedance matching circuit may result in mutual inductive coupling occurring between components or other non-ideal interactions between the components.

There exists scope for implementation of an in-package impedance matching circuit that mitigates at least some non-ideal interactions.

SUMMARY OF INVENTION

According to a first aspect, there is provided a package comprising: a die, such as an integrated circuit die, having a first terminal and a second terminal; and an impedance matching network coupled to the second terminal and comprising a first inductor and a first capacitor, wherein the first capacitor is preferably an integrated capacitor arranged on the die; wherein the first inductor comprises first bond wire connections coupled between the second terminal and a first bond pad on the die, and second bond wire connections coupled between the first bond pad and a second bond pad coupled to the first capacitor. The first bond wire connections and the second bond wire connections are preferably adjacently arranged.

The first bond wire connections may be configured to carry a current in a first direction and the second bond wire connections are configured to carry the current in a second direction. For example, the first bond wire connections and the second bond wire connections may be configured such that during operation the instantaneous currents carried by these respective connections flow in opposite directions. The first and second bond wire connections may be over the surface of the die. There may be an axis of orientation between the first terminal and the second terminal and the first and second bond wire connections may be orientated substantially along the axis.

The first bond pad may be comprised in a first bond pad bar and the second bond pad may be comprised in a second bond pad bar, wherein the first terminal and the second terminal each preferably extend along a first direction, and wherein the first bond pad bar and the second bond pad bar are preferably arranged parallel to said first direction.

The package may further comprise: a first package lead coupled to the first terminal; and a second package lead coupled to the second terminal. The first bond pad may be positioned on the die between the second terminal and the first package lead. The second bond pad may be positioned on the die between the second terminal and the second package lead, or the second bond pad is positioned on the die such that the second terminal is arranged in between the second bond pad and the second package lead.

The package may further comprise third bond wire connections coupled between the second terminal and the second package lead. Each of the first bond wire connections may be associated with a respective one of the second bond wire connections forming a bond wire connection pair and the bond wire connection pair may be further associated with one of the third bond wire connections.

The second bond pad and the second terminal may be arranged with respect to each other such that, for each bond wire connection pair, a point coupling the third bond wire connection to the second terminal is interleaved between a point coupling the first bond wire connection to the second terminal and a point coupling the second bond wire connection to the second bond pad. The second bond pad and the second terminal may be interdigitated. The second terminal and second bond pad may be interdigitated such that, for each bond wire connection pair, a point coupling the first bond wire connection to the second terminal is aligned with a point coupling the second bond wire connection to the second bond pad.

The first inductor may be a shunt inductor. The first capacitor may be a dc decoupling capacitor. A bond wire connection may comprise one or more bond wires. The Impedance matching network may be for functional circuit on the die. The package may comprise at least one further die. The die may comprise a plurality of further functional circuits. Each of the first bond wire connections may be associated with a respective one of the second bond wire connections forming a bond wire connection pair. The bond wire connection pair may be further associated with one of the third bond wire connections. The package may further comprise fourth bond wire connections coupled to the first terminal.

The first bond pad may be positioned between the first terminal and the first package lead. Each of the fourth bond wire connections may be associated with a respective bond wire connection pair and may be interleaved between the bond wire connections of the respective bond wire connection pair. The package may further comprise a further impedance matching circuit coupled to the first terminal and comprising a second inductor and a second capacitor. The second inductor may be coupled between the first terminal and the second capacitor. The second capacitor may be further coupled to ground. The fourth bond wire connections may form the second inductor. The package may comprise fifth bond wire connections coupled between the first package lead and the second capacitor.

The second inductor and the second capacitor may be integrated on the die. The first package lead may be coupled to the integrated inductor via further bond wire connections. The first terminal may be an input terminal and the second terminal may be an output terminal. The first bond wire connections and the second bond wire connections may be parallel. The first bond wire connections and the second bond wire connections may be symmetrical. The first and second bond wire connections may be configured to carry current in substantially opposite directions. The current may be a shunt current of the output impedance matching circuitry.

The magnetic fields generated respectively by the first and second bond wire connections may at least partial cancel each other out. The inductance of the first inductor may at least partially be determined by the shape of the first and second bond wire connections. The first and second bond wire connections may form respective loops. The inductance of the first inductor may be determined at least partially by a difference in the shape of the loop made by the first bond wire connections and the shape of the loop made by the second bond wire connections. The functional circuit may be a transistor, the first terminal may be an intrinsic gate of the transistor and the second terminal may be an intrinsic drain of the transistor. The transistor may be a laterally diffused metal oxide semiconductor.

According to a second aspect, there is provided a package comprising a plurality of dice, each comprising functional circuitry and a first terminal and a second terminal; and a respective impedance matching circuit for each of the dice, each impedance matching circuit coupled to the respective second terminal and comprising a shunt inductor and capacitor; wherein the respective shunt inductors each comprise: first shunt bond wire connections coupled between the first terminal of the die and a bond pad on the die, and second shunt bond wire connections coupled between the bond pad and the capacitor.

According to a third aspect, there is provided an RF power amplifier package comprising a die comprising power amplifier circuitry and a first terminal and second terminal; and impedance matching circuit coupled to the respective second terminal and comprising a shunt inductor and capacitor; wherein the shunt inductor comprises: first shunt bond wire connections coupled between the first terminal of the die and a bond pad on the die, and second shunt bond wire connections coupled between the bond pad and the capacitor.

BRIEF DESCRIPTION OF DRAWINGS

Embodiments will be described, by way of example only, with reference to the drawings, in which.

It will be appreciated that for features that span more than one drawing like reference numerals indicate the like feature.

DESCRIPTION

Figure 1:
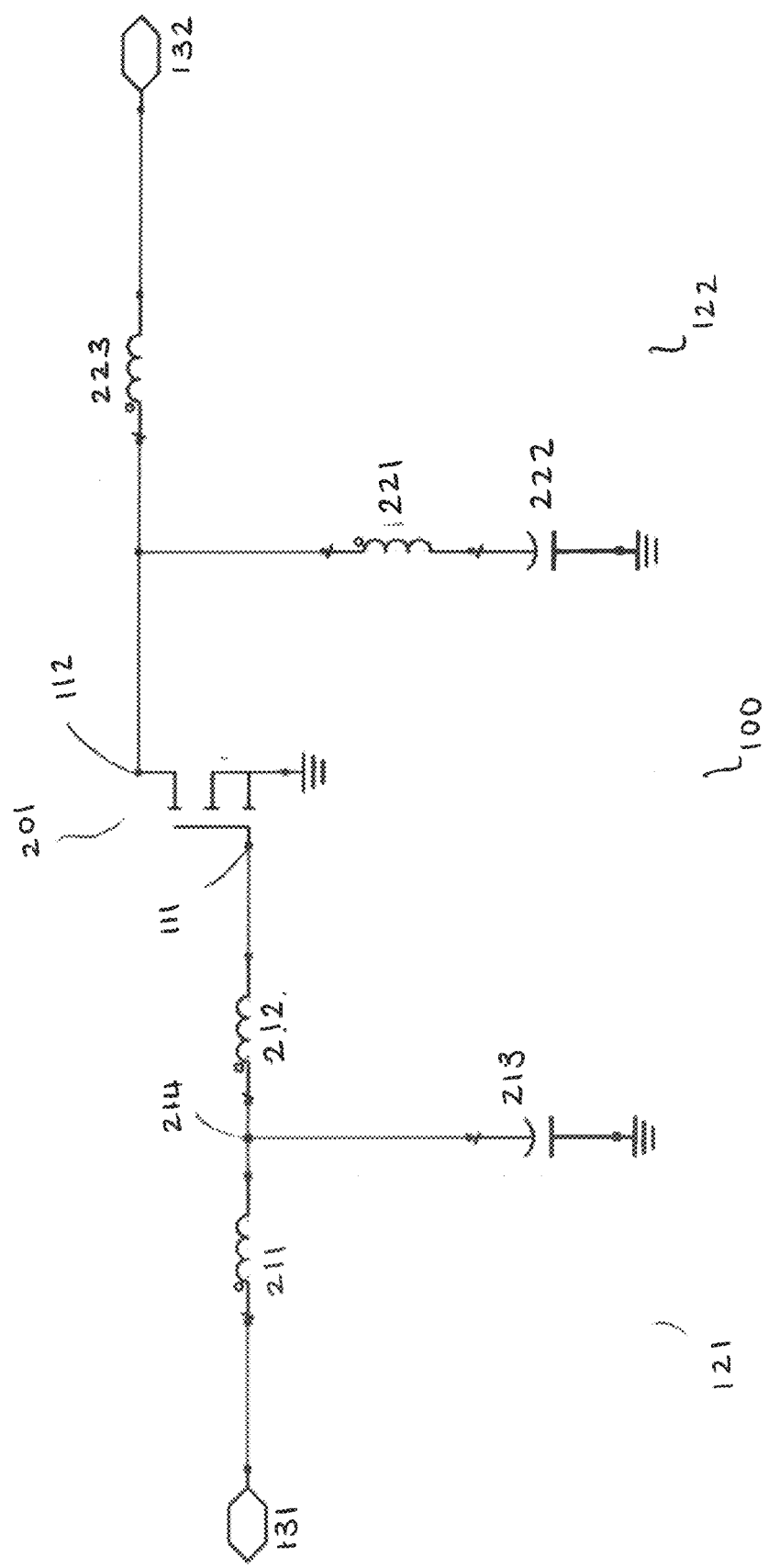
FIG. 1 is an example schematic of impedance matching circuitry.

FIG. 1 shows an example schematic of on-die functional circuitry 201 coupled to impedance matching circuitry 121 and 122 that may be implemented in a package 100. The on die circuitry 201 comprises an input terminal 111 and an output terminal 112 for coupling the on-die circuitry to further circuitry, for example the in-package impedance matching circuitry 121 and 122. The in-package circuitry 121 and 122 further comprise input and output leads 131 and 132 for coupling the in-package circuitry to further circuitry external to the package.

In this example, the on-die circuitry is shown as a transistor 201 having a first terminal 111 and a second terminal 112 for coupling the transistor to off die circuitry. The first terminal 111 may couple the transistor 201 to input impedance matching circuitry 121. The second terminal 112 may couple the transistor 201 to output impedance matching circuitry 122. The input and output impedance matching circuitry 121, 122 in this example are respectively coupled to a first package lead 131 and a second package lead 132. The first and second package leads 131, 132 may couple the in-package circuitry 201, 121 and 122 to circuitry external to the package.

In this example, the input impedance matching circuit 121 comprises a first inductor 212, a second inductor 211 and a pre-match capacitor 213. The first inductor 212 is coupled between the package lead 131 and a node 214. The second inductor 212 is coupled between the node 214 and the terminal 111 of the die 110. The pre-match capacitor 213 is coupled between the node 214 and a reference voltage such as ground.

The output impedance matching circuit 122 may be provided by a shunt inductor network. The shunt inductor network 122 may comprise a first or shunt inductor 221, a dc decoupling capacitor 222 and a second inductor 223. The first or shunt inductor 221 may be coupled between the terminal 112, which in this case is the drain terminal of the transistor 201, and to the decoupling capacitor 222. The decoupling capacitor 222 may be coupled between the first inductor 221 and a reference terminal such as ground. The second inductor 223 may be coupled between the terminal 112 and the package lead 132.

Impedance matching circuitry, such as that depicted in FIG. 1, may be physically implemented in-package in order to realise the impedance matching.

Figure 2:
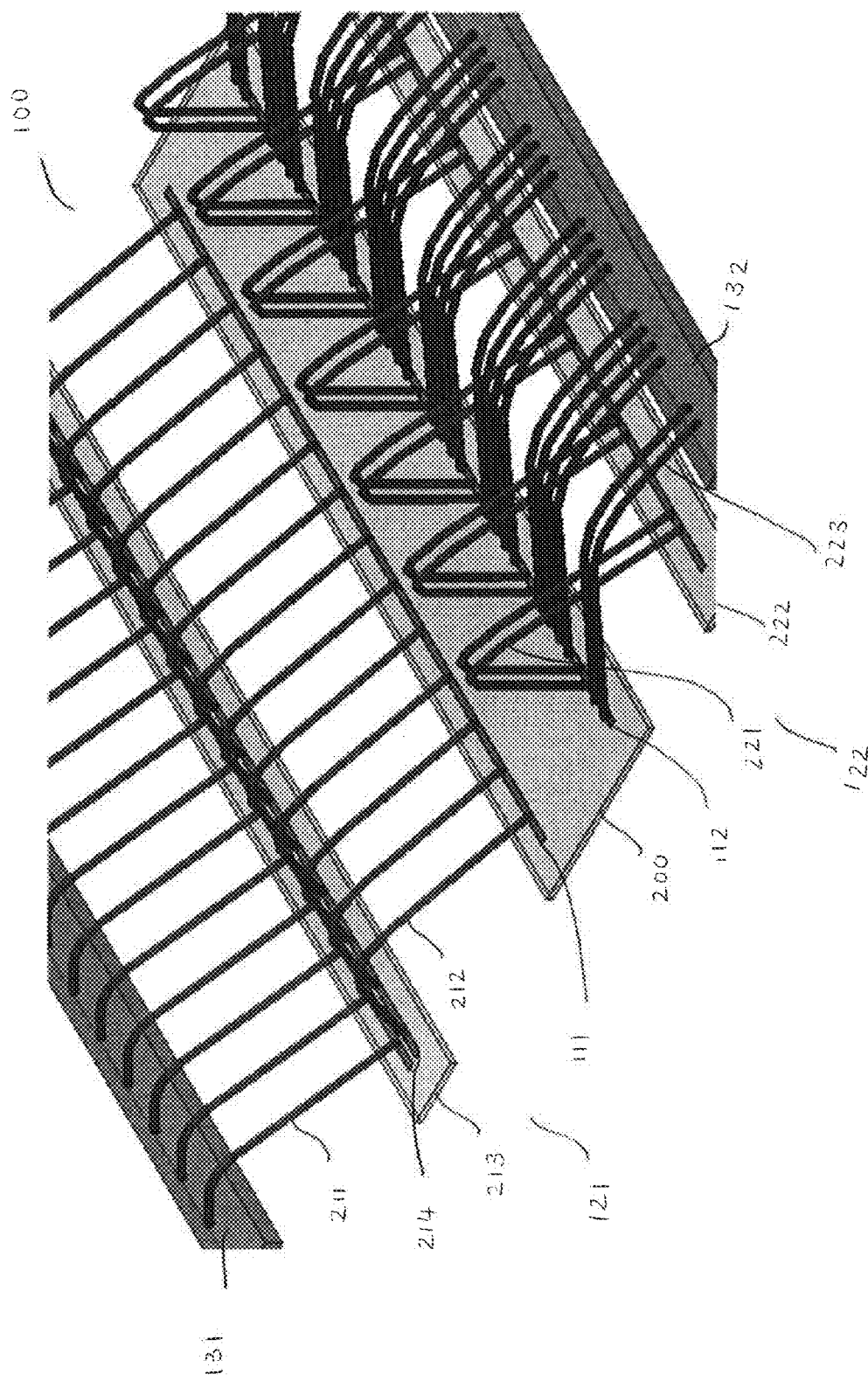
FIG. 2 shows a physical implementation of the schematic of FIG. 1.

FIG. 2 shows an example of the physical implementation of the in-package circuitry 100 of FIG. 1. FIG. 2 shows the die 200, package leads 131 and 132 and capacitors 222 and 213 that are coupled together through a plurality of bond wire connections 211, 212, 221 and 223. Each of the bond wire connection may comprise one or more bond wires and may provide an inductance which corresponds to the inductors 211, 212, 221 and 223.

The input impedance matching circuit 121 is implemented with a pre-match capacitor 213, a first inductor 211 and a second inductor 212. The first inductor 211 is provided by a plurality of bond wire connections 211 between the lead 131 and the capacitor 213. The second inductor 212 is provided by a plurality of bond wire connections 212 between the capacitor 213 and the input terminal 111 of the die 200.

The output impedance matching network 122 is implemented with a decoupling capacitor 222, a shunt inductor 221 and a second inductor 223. The first or shunt inductor 221 is provided by a plurality of bond wire connections between the output die terminal 112 and the capacitor 222. The second inductor 223 is provided by a plurality of bond wire connections between the output die terminal 112 and the package lead 132.

In the example of FIG. 2, inductance is provided by the bond wire connections. However, contributions to the inductance provided by a bond wire connection may be made by factors external to the bond wire connection. For example, a contribution may be made by passive components of the matching circuit and/or magnetic fields in the vicinity of a bond wire.

For example, in the implementation of FIG. 2, a potential contribution to inductance may be made by a mutual coupling between the second inductor 223 of the output impedance matching circuitry 122 and the shunt inductor 221. In this case, for example due to the layout of the physical implementation of the impedance matching circuitry, a magnetic coupling may occur between the bone wire connections forming the shunt inductor 221 and the bond wire connections forming the bond wire connection 223 coupling the second die terminal 112 to the second lead 132. This may, for example, lead to an additional mutual inductance in the circuitry.

Referring to FIG. 1, this mutual inductance (not shown) may be equivalently represented in schematic as a series inductor at the second terminal of the die 112. The mutual inductance may transform the output impedance to a lower level of output impedance before the shunt inductor 221 becomes effective. The introduction of such a mutual inductance may render the impedance matching circuitry less effective.

The effectiveness of the impedance matching circuitry may be also limited in some examples due to the increase of the reactive part of the output impedance of the functional circuitry. Referring to FIG. 2, in order to reach a desired inductance level, the bond wire connections forming the shunt inductor 221 may need a certain amount of space to form a loop corresponding to the desired inductance. The space required to form such a loop may determine the length of the bond wire connections 223 between the lead 132 and the terminal 112. This is so that the bond wire connections 223 may cover the distance between lead 132 and terminal 112 while allowing the requisite space for the loop of 221. The bond wire connections 223 may form an inductance with a large imaginary part (jwL) contribution to the impedance seen outside the package 100. In some implementations, the high reactive part of the output impedance may have a negative impact on functional circuitry such as the broadband power amplifier design.

In another example, the effectiveness of the impedance matching circuitry may be limited due to inductive coupling between the bond wire connections to the respective terminals of the die. Referring again to FIG. 2, in some cases, inductive coupling may occur between the bond wire connections (forming inductor 212) to the first terminal 111 and the bond wire connections (forming the shunt inductor 221) to the second terminal 112. This creates an inductive coupling between the input and output impedance matching circuitry. This coupling may complicate the stability situation of the functional circuitry on the die 200, for example any transistors on the die.

It will thus be appreciated that the physical implementation of the impedance matching circuitry is of interest in terms of the efficiency of the impedance matching circuitry.

Embodiments of the present disclosure aim to provide a configuration of a shunt inductor and bond wire arrangement.

In embodiments, a shunt inductor may be disposed over the surface of the die. The shunt inductor may be comprised of a plurality of first bond wire connections coupled between an output terminal of the die and a first bond pad. The shunt inductor may further be comprised of a plurality of second bond wire connections coupled between the first bond pad and a second bond pad. The output terminal may be positioned between an output package lead and the first bond pad such that the shunt inductor is disposed over the surface of the die. The output terminal may further be between the first bond pad and the second bond pad.

The first bond wire connections may carry a shunt current in a first direction and the second bond wire connections may carry the shunt current in a second direction where the second direction is substantially opposite the first direction. The magnetic field realised by the first bond wire connections and the second bond wire connections may therefore be concentrated in an area between the first and second bond wire connections. This may draw the magnetic field concentration away from the active area of the die.

In particular, each of the first bond wire connections may be paired with one of the second bond wire connections where each bond wire connection of the pair carries the shunt current in a substantially opposite direction. The magnetic field created by the flow of the shunt current through the shunt inductor may be concentrated in the area between the bond wire connection pair. The bond wire connection pair may comprise one of the first bond wire connections and one of the second bond wire connection.

In further embodiments, third bond wire connections may be coupled between the output terminal and an output package lead. Each of the third bond wire connections may be interleaved between a first and second bond wire connection of a respective bond wire connection pair. In particular, for each bond wire connection pair, a respective point coupling a third bond wire connection to the output terminal may be interleaved between a point coupling the first bond wire connection to the output terminal and a point coupling the second bond wire connection to the second bond pad. In some embodiments, such interleaving may be due to an interdigitated configuration of the second bond pad and the output terminal.

Figure 3:
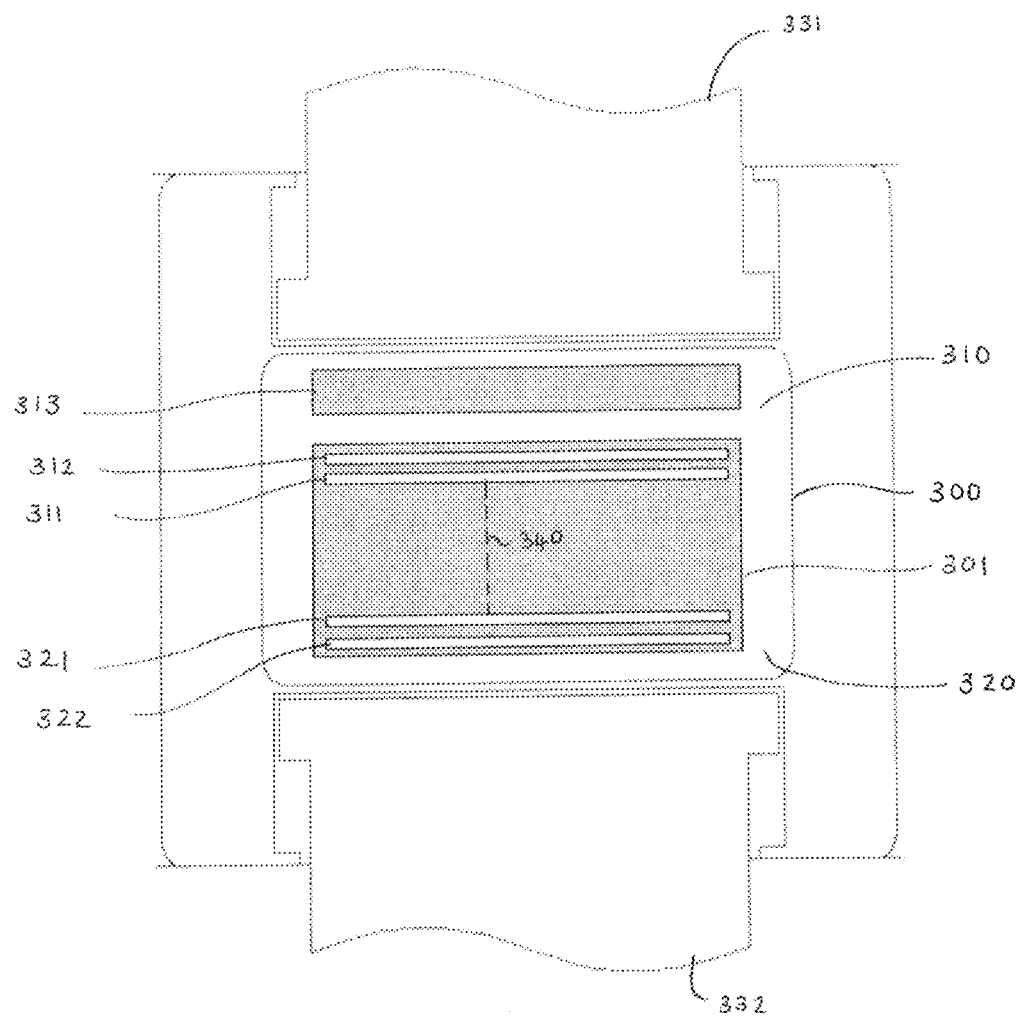
FIG. 3 shows an example of a package.

FIG. 3 shows an example of a package 300 in which some embodiments may be implemented.

The package 300 comprises a die 301 having on-die functional circuitry, an input package lead 331 and an output package lead 332. The package 300 further comprises input impedance matching circuitry 310 and output impedance matching circuitry 320. The on-die circuitry of die 301 may be coupled to circuitry external to the die 301 via a first terminal 311 and a second terminal 321. The die 301 further comprises a first bond pad 312 and a second bond pad 322. The first and second bond pads 312 and 322 may provide further coupling to circuitry external to the die 301.

The first bond pad 312, second bond pad 322 and second terminal 321 may be on the surface of the die. The second terminal 321 may be positioned between the first bond pad 312 and the output package lead 332. In this example, the first bond pad 312 is positioned between the first or input package lead 331 and the second terminal 321. The second bond pad 322 is positioned between the second or output package lead 322 and the second terminal 321. In further examples, the second or output terminal 321 may be positioned between the first bond pad 312 and the second bond pad 322.

In FIG. 3, the input impedance matching circuitry 310 is provided between the first terminal 311 and the first package lead 331 and the output impedance matching circuitry 320 is provided between the second terminal 321, the second package lead 332 and over the die surface between the first bond pad 312 and second terminal 321 and second bond pad 322. The input impedance matching circuitry 310 may comprise a first capacitor 313.

A line across the surface of the die 301 from the first terminal 311 to the second terminal 321 may be considered to define a first axis of orientation 340. The axis of orientation 340 may provide an orientation for the shunt inductor.

Figure 4:
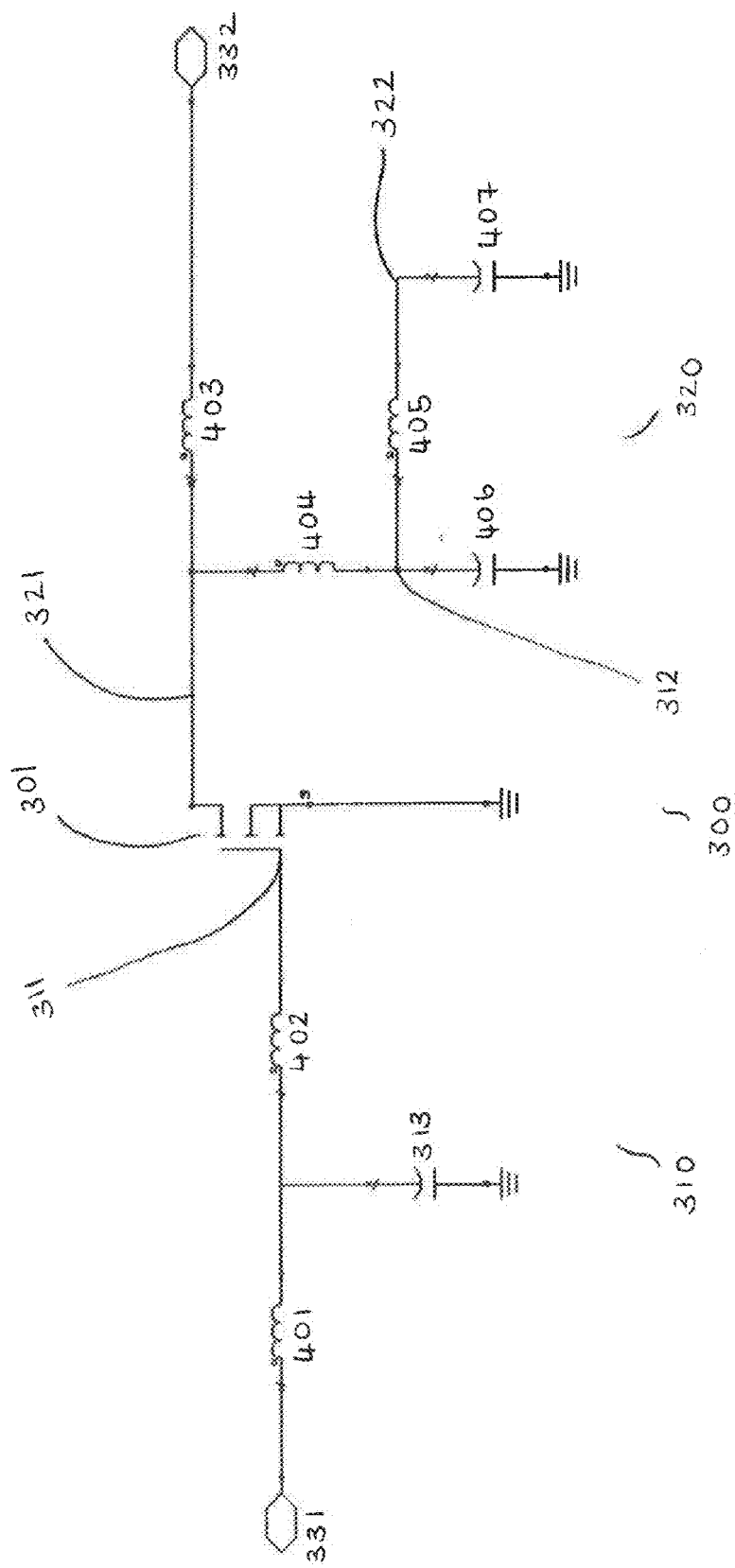
FIG. 4 is a schematic showing impedance matching circuitry according to a further example.

FIG. 4 is a schematic diagram showing an example of an input and output impedance matching circuit that may be provided in some embodiments. FIG. 4 shows a simplified schematic of the package 300 comprising on-die functional circuitry 301. It will be appreciated that the like features in FIGS. 3 and 4 are indicated by like reference numerals.

FIG. 4 shows the functional on-die circuitry 301 having a first or input terminal 311 and a second or output terminal 321. The package 300 of FIG. 4 comprises a first or input package lead 331 and a second or output package lead 332. Input impedance matching circuitry 310 is coupled between the first package lead 331 and the first terminal 311 and output impedance matching circuitry 320 is coupled between the second terminal 321 and the second package lead 332.

The impedance matching circuitry 310, 320 may for example comprise passive components such as bond wires, capacitors and inductors. These passive components may be arranged in order to match the impedance of the on-die circuitry of the die 301. In some examples, the impedance matching circuitry 310, 320 may overlap the die 301 in that some of the impedance matching components may be integrated on-die. For example, the die 301 may comprise an integrated inductor or include the capacitor 313 as an integrated component.

The input impedance matching circuitry 310 of FIG. 4 comprises a first inductor 401 coupled between the input package lead 331 and a pre-match capacitor 313. A second inductor 402 is coupled between the pre-match capacitor 313 and the input terminal 311.

The output impedance matching circuitry 320 comprises a shunt inductor and dc decoupling capacitance coupled between the output terminal 321 and ground. The shunt inductor may comprise a first inductor 404 coupled between the output terminal 321 and a first bond pad 312 and a second inductor 405 coupled between the first bond pad 312 and a second bond pad 322. A first capacitor 406 may be provided between the first bond pad 312 and ground. The dc-decoupling capacitance may be formed of a second capacitance 407 coupled between the second bond pad 322 and ground. The output impedance matching circuit 320 may further comprise a third inductor 403 coupled between the second package lead 332 and the output terminal 321.

In this example, the on-die functional circuit comprises a transistor 301 with a gate terminal coupled to the input terminal 311, a drain terminal coupled to the output terminal 321 and a source terminal coupled to a reference voltage such as ground. The transistor 301 has been depicted as a laterally diffused metal oxide semiconductor (LDMOS) power transistor however it will be appreciated that the on-die circuitry may be another type of functional circuit and the matching circuitry may be adjusted accordingly.

In the example of FIG. 4, the input impedance of the transistor 301 may be formed of an input capacitance of the transistor 301. The input impedance matching circuitry 310 may form a low pass pre-match network which provides a resonance circuit formed by this input capacitance of the transistor 301 (not explicitly shown) in series with the pre-match capacitor 313 and the second inductor 402. The first inductor 401 may represent the inductance of the bond wire connection between the pre-match capacitor 313 and the first package lead 331.

The output impedance of the transistor 301 may be formed by an output capacitance of the transistor 301 (not shown). In the output impedance matching circuit 320, the output capacitance of the transistor 301 may form a parallel resonance with the shunt inductance 404, 405 to the ground (via the dc decoupling capacitor 407). The inductors 404 and 405 forming the shunt inductance may therefore provide a compensation (fully or partially) for the output capacitance of the transistor 301. The aim, in this example, is to increase the impedance seen from outside the package and thus influence the operational bandwidth of the transistor. The first inductor 403 may represent the inductance of the bond wire connections between the second package lead 332 and the die terminal 321.

Figure 5:
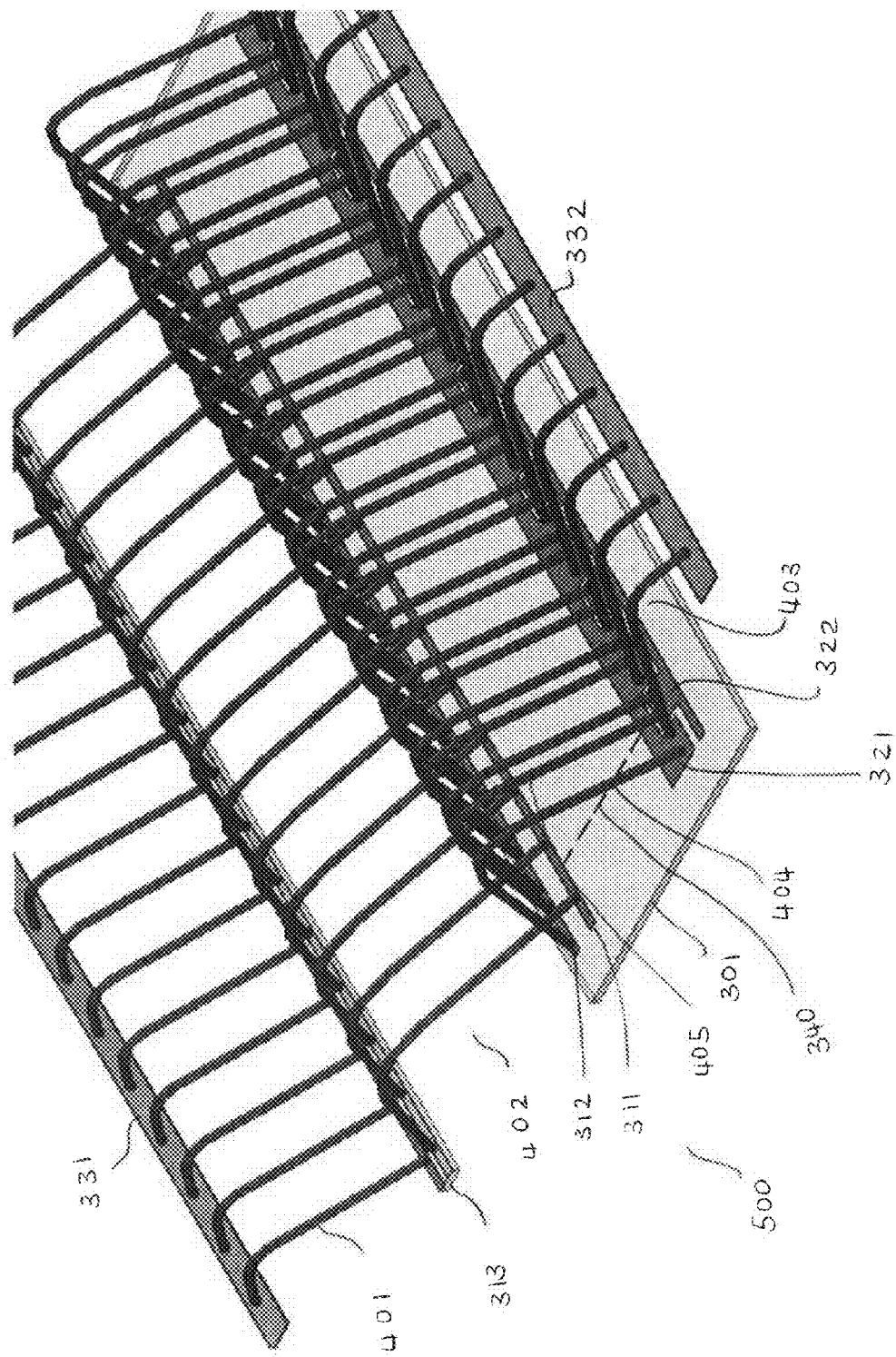
FIG. 5 shows a physical implementation of the circuitry of FIG. 4.

The physical implementation of the input and output impedance matching networks may influence the effect of the surrounding environment on the circuit. For example, the physical proximity of bond wires with other bond wires may result in parasitic inductance and/or a mutual magnetic coupling between bond wires. FIG. 5 shows the physical arrangement of the bond wire connections with respect to other components of the package according to an embodiment of the present disclosure.

FIG. 5 shows a package 500 comprising a die 301, input package lead 331, output package lead 332 and capacitor 313. The die 301 comprises a first die terminal 311, second die terminal 321, first bond pad 312 and second bond pad 322. The first and second bond pads 312 and 322 may be provided on the surface of the die 301. In this example, the bond pads 312 and 322 are provided on the same surface of the die as the terminals 311 and 312.

Input impedance matching circuitry is arranged between the input package lead 331 and the input terminal 311. In this example a plurality of first bond wire connections forming a first inductor 401 are coupled between the input package lead 331 and the capacitor 313. Bond wire connections forming a second inductor 402 are coupled between the capacitor 313 and the first terminal 311.

Output impedance matching circuitry is arranged between the output package lead 332 and the output terminal 321. The output impedance matching circuitry comprises a shunt inductor arranged between the output terminal 321 and the second bond pad 322. The shunt inductor comprises plurality of first bond wire connections forming a first inductor 404 coupled between the output terminal 321 and the first bond pad 312. The shunt inductor may further comprise second bond wire connections forming a second inductor 405 coupled between the first bond pad 312 and a second bond pad 322.

The die 301 may further comprise the first integrated capacitor 406 (not shown) coupled to the first bond pad 312. In some embodiments, the first bond pad may be a first terminal of the first integrated capacitor 406. The die 301 may further comprise the second integrated capacitor 407 coupled to the second bond pad 322. In some embodiments, the second bond pad 322 may be a first terminal of the second integrated capacitor.

A plurality of third bond wire connections forming a third inductor 403 are coupled between the output package lead 332 and the output terminal 321 of the die. The third bond wire connections 403 may comprise a plurality of bond wire connections coupled between the output package lead 332 and the output terminal 321.

An axis of orientation 340 is shown in FIG. 5. The axis 340 is along a straight line from the output terminal 321 to the input terminal 311. The axis 340 depicts an axis of orientation of the shunt inductor 404, 405. The first and second bond wire connections 404 and 405 run along the axis of orientation over the surface of the die.

Figure 6:
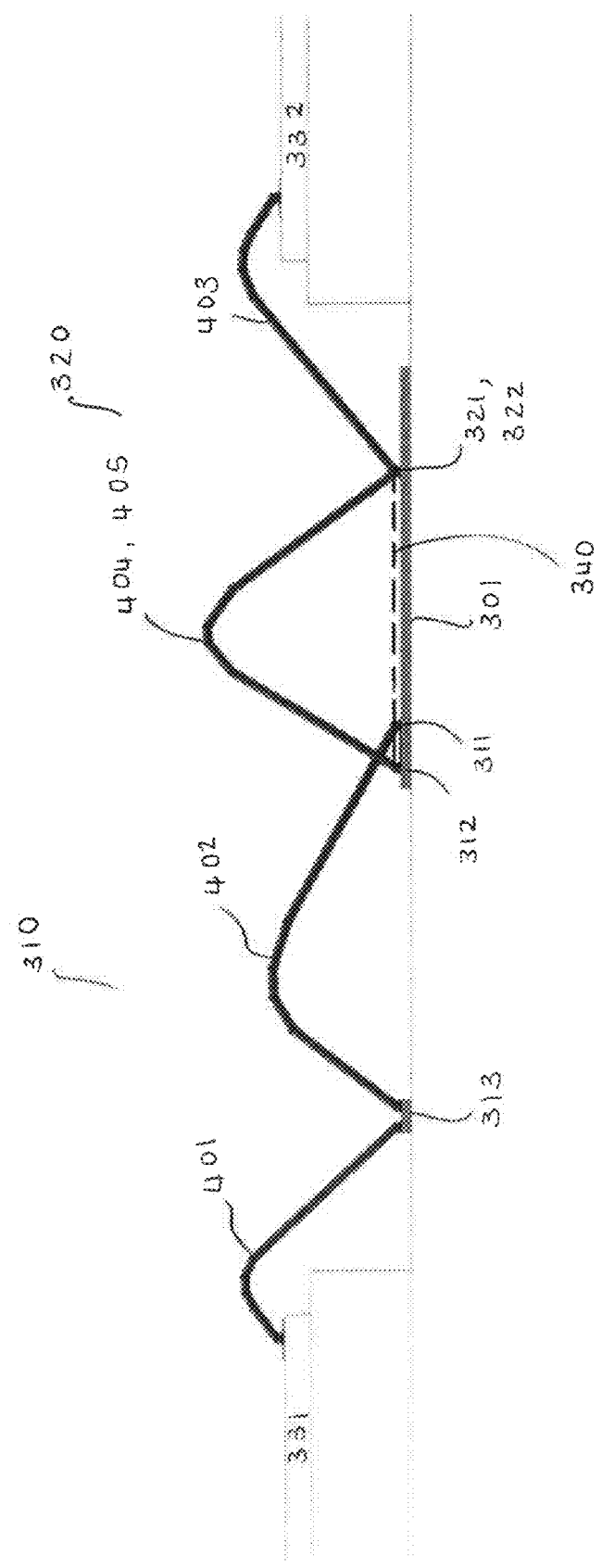
FIG. 6 shows a profile view of the physical implementation of FIG. 5.

A profile view of the package 500 of FIG. 5 is shown in FIG. 6. FIG. 6 shows the input package lead 331, output package lead 332, die 301 and capacitor 313. The die 301 comprises an input terminal 311, output terminal 321, first bond pad 312 and second bond pad 322. The input impedance matching circuitry 310 may be arranged between the input terminal 311 and the input package lead 331. The output impedance matching circuitry 320 may be arranged between the output package lead and the output terminal as well as over the surface of the die 301. FIG. 6 further shows the axis of orientation 340 formed by a straight line between the input and output terminals. The axis of orientation 340 may define an axis of orientation for the bond wire connections of the shunt inductor 404, 405.

The input impedance matching circuitry 310 may comprise bond wire connections 401 and 402. It will be appreciated that FIG. 6 is a profile view and only one bond wire connection of each of the bond wire connections 401 and 402 is shown. The output impedance matching circuitry 320 may include the shunt inductor comprising the first bond wire connections 404 and second bond wire connections 405 disposed over the surface of the die 301. The output impedance matching circuitry 320 may further comprise the third bond wire connections 403. Again, it will be appreciated that FIG. 6 is in a profile view and that only one bond wire connection of each of the bond wire connections 404 and 405 is shown.

As can be seen from FIGS. 5 and 6, the shunt inductor formed of the bond wire connections 404 and 405 is disposed over the surface of the die. The shunt inductor runs from the output terminal 321, to a first bond pad 312 and then to a second bond pad 322. The bond pads and output terminal are on the surface of the die and are arranged so that the output terminal 321 is between the first bond pad and the output package lead 332. In this example, the output terminal 321 is also positioned between the first bond pad 312 and the second bond pad 322. In some embodiments, the first bond pad 312 may be positioned between the input package lead 331 and the output terminal 321.

The first bond wire connections 404 of the shunt inductor may be disposed in a first direction from the output terminal 321 to the first bond pad 312 and the second bond wire connections 405 may be disposed in a second direction from the first bond pad 312 to the second bond pad 322. The first bond wire connections 404 may be configured to carry the shunt current in the first direction and the second bond wire connections 405 may be configured to carry the shunt current in the second direction. In this example, the individual bond wire connections of the first and second bond wire connections 404 and 405 are parallel and the first direction is substantially opposite to the second direction.

In the example of FIG. 6, the loop formed by each bond wire connection of the first bond wire connections 404 and the loop formed by each bond wire connection of the second bond wire connections 405 may be similar in that they may be parallel and/or symmetrical. This is shown by the single profile of the bond wire connections 404 and 405 in FIG. 6. In some embodiments, the loop shape and length of the bond wire connections may be similar to allow the resulting magnetic fields generated by those bond wire connections to be of similar shape. It will however be appreciated that the resultant fields will differ with the direction of the shunt current through the bond wire connections.

In some embodiments, for example shown in FIGS. 5 and 6, the second bond wire connections 402 of the input impedance matching circuit 310 may overlap the respective bond wire connections 404 and 405 in the proximity of their coupling points to the first bond pad 321. Additionally, in some embodiments, the respective points coupling the first bond wire connections 404 to the output terminal 321 and the respective points coupling the second bond wire connections 405 to the second bond pad 322 may be aligned. In this case, the second bond pad 322 and the output terminal 321 may be interdigitated. Additionally, in some embodiments, each of the third bond wire connections 403 may be interleaved between a pair of bond wire connections forming a current path for the shunt inductor. The pair of bond wire connections may comprise one of the first bond wire connections 404 and one of the second bond wire connections 405.

Figure 7:
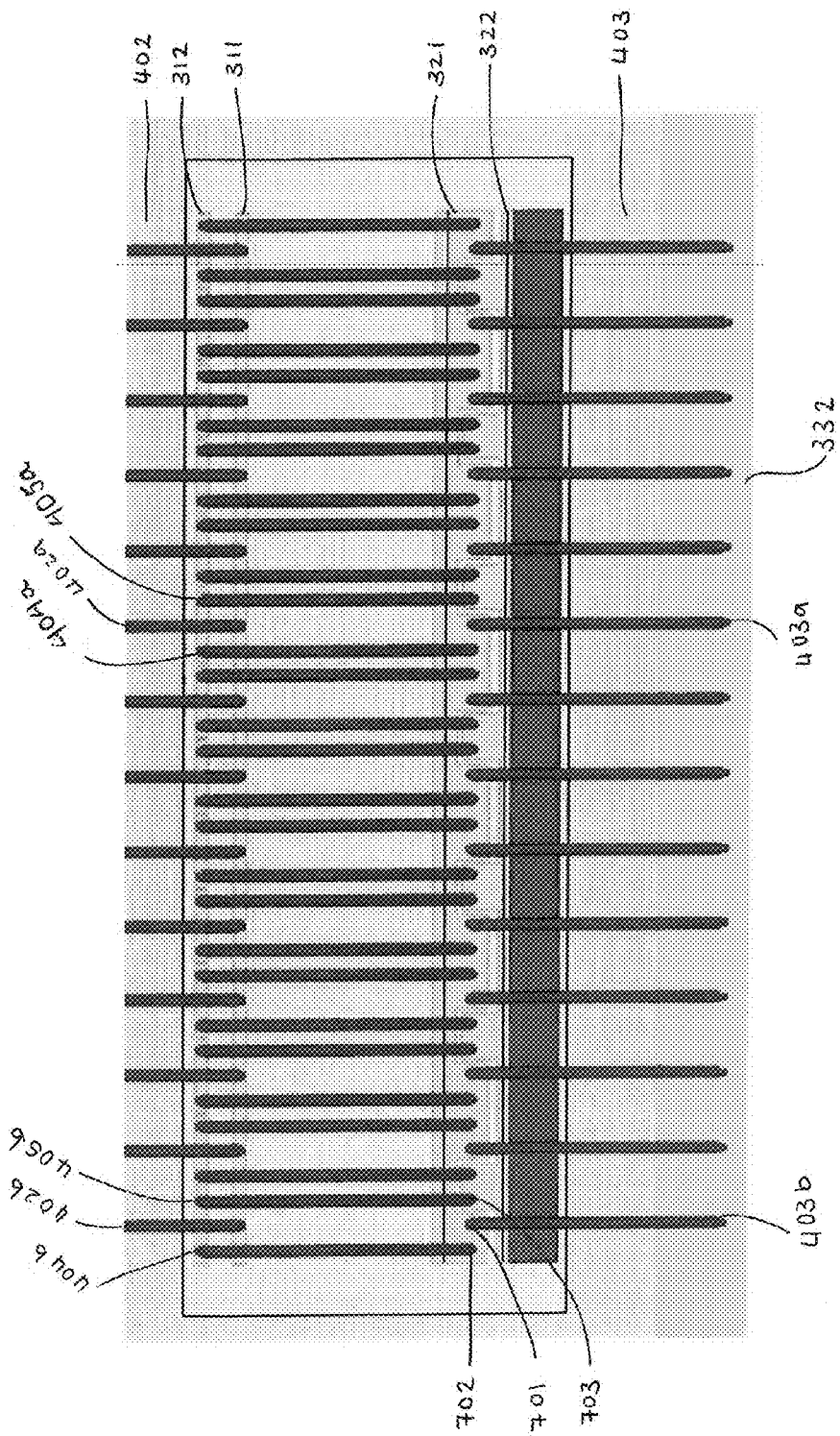
FIG. 7 shows a top view of the physical implementation of FIG. 5.

FIG. 7 shows a top view of the package 500. FIG. 7 shows the output package lead 332 and die 301 having an input terminal 311, output terminal 321, first bond pad 312 and second bond pad 322. A shunt inductor of the output impedance matching circuitry 320 comprises first bond wire connections 404a and 404b coupled between the output terminal 321 and the first bond pad 312 and second bond wire connections 405a and 405b coupled between the first bond pad 312 and a second bond pad 322. The second bond pad 322 may be coupled to a capacitor 407 integrated on the die 301. The first bond pad 312 may be coupled to a first capacitor 406 integrated on the die 301. Third bond wire connections 403 may be coupled between the input package lead 332 and the input terminal 321.

The input impedance matching circuit 310 comprises bond wire connections 402a and 402b coupled to the input terminal 312. It will be appreciated that an input package lead and/or pre-matching capacitor is not shown.

The shunt inductor comprises first bond wire connections 404a and 404b and second bond wire connections 405a and 405b. Each of the first bond wire connections 404a, 404b may be associated with one of the second bond wire connections 405a, 405b and may form a pair to provide a current path for the shunt inductor. For example, a bond wire connection 404a of the first bond wire connections 404 may be paired with a bond wire connection 405a of the second bond wire connections 405. A portion of the shunt current may flow along the bond wire connection 404a in a first direction from the output terminal 321 to the first bond pad 312. The portion of the shunt current may then flow through the bond wire connection 405a in a second direction from the first bond pad 312 to the second bond pad 322.

For example, the first bond wire connections 404 may comprise a plurality of bond wire connections including bond wire connections 404a and 404b and the second bond wire connections 405 may comprise a plurality of bond wire connections including bond wire connections 405a and 405b. In the example of FIG. 7, the bond wire connections 404a and 404b forming part of the bond wire connections 404 are paired with the respective bond wire connections 405a and 405b forming part of the bond wire connections 405. A portion of the shunt current may be shunted through each pair, for example a portion of the shunt current may be shunted from the output terminal through the bond wire connection 404a and then through the bond wire connection 405a. Another portion of the shunt current may be shunted through the bond wire connection 404b and back through the bond wire connection 405b.

Each of the bond wire pairs 404a, 404b and 405a, 405b may be additionally associated with one of the third bond wire connections 403. In some examples, the bond wire connection pairs may additionally be associated with one of the bond wire connections 402.

The bond wire connections 404b and 405b of FIG. 7 show one example of the arrangement of a bond wire connection pair of the bond wire connections 404 and 405. It will be appreciated that each bond wire connection pair may be arranged similarly. The bond wire connections 404b and 405b are two bond wire connections forming the shunt inductance. The first bond wire connection 404b is coupled between the output terminal 321 and the first bond pad 312. The second bond wire connection 405b is coupled between the first bond pad 312 and the second bond pad 322. The first bond wire connection 404b comprises a coupling point 702 between the bond wire connection 404b and the output terminal 321. The second bond wire connection 405b comprises a coupling point 703 between the bond wire connection 405b and the second bond pad 322. In some embodiments, the coupling points 702 and 703 may be aligned.

The points 702 and 703 may be aligned such that the first and second bond wire connections 404 and 405 traverse substantially the same distance on the surface of the die. It will of course be appreciated that the bond wire connections may still be of different lengths as, in some embodiments, the loop shape of the bond wire connections may be different.

A third bond wire connection 403b forming part of the third bond wire connections 403 may be interleaved between the coupling points 702 and 703 of the bond wire connections 404b and 405b. In other words, a coupling point 701 of the third bond wire connection 403b with the output terminal 321 may be interleaved between the coupling points 702 and 703 of the first and second bond wire connections 404b and 405b. For example, the coupling point 701 may be between the coupling point 702 and the coupling point 703. In some examples, the coupling point 701 (and hence the bond wire connection 403b) may positioned substantially equidistant between the coupling points 702 and 703 (and hence the bond wire connections 404b and 405b). It will be appreciated that in some embodiments, each pair of the bond wire connections are interleaved by a bond wire connection forming part of the third bond wire connection 403.

This interleaving and/or alignment may be achieved through an inter-digitation of the second bond pad 322 and the output terminal 321. In other words, the second bond pad 322 and the output terminal 321 may be provided with reciprocally shaped protrusions and indentations and/or have an inverse relationship in shape.

In the example of FIG. 7, the second bond pad 322 and the output terminal 321 have a reciprocal square wave shape. However it will be appreciated that the second bond pad 322 and output terminal 321 may be of any suitable alternative shape. For example the second bond pad 322 may have a square, triangular or sinusoidal wave shape and the output terminal 321 may be of an inverse shape. Any suitable and reciprocal shape may be implemented that facilitates the interleaving of bond wire connection coupling points 701, 702 and 703.

When in operation, current may be shunted or conducted from the output terminal 321, through the shunt inductor and to ground via the capacitor 407 coupled to the second bond pad. The first bond wire connections 404 conduct current in a direction from the output terminal 321 to the first bond pad 312. The second bond wire connections 405 conduct current in a direction from the first bond pad 312 to the second bond pad 322. The current then passes through the capacitor 407 coupled to the second bond pad 322 to ground. The third bond wire connections 403 conduct current in a direction from the output terminal 321 to the output package lead 332.

The current flow direction of the first bond wire connections 404 of the shunt inductor and the current flow direction of the second bond wire connections 405 of the shunt inductor are in opposite directions but are of equal magnitude. The majority of the magnetic field created may be considered to be encompassed within the area between each two paired bond wire connections 404b and 405b making up the shunt inductor. This may draw the influence of the magnetic field away from the active die beneath shunt inductor 404, 405. The concentration of the magnetic field between each of the bond wire connection pairs of the bond wire connections 404 and 405 may draw the influence of the magnetic coupling away from adjacent devices. This may have an effect on the isolation of the devices.

In some embodiments where a bond wire connection of the lead bond wire connections 403 (associated with a bond wire connection pair 404b and 405b) is positioned substantially equidistant from the first bond wire connection 404b and the second bond wire connection 405b of that pair, a mutual coupling effect from one bond wire connection 404b may be offset by a mutual coupling from the other bond wire connection 405b.

In some embodiments, the capacitor 407 may be integrated on the die 301. In this case, the distance between the output terminal 321 and the output package lead 332 may be physically smaller due to removal of the external capacitor. Additionally the disposition of the shunt inductor on the surface of the die may allow for a shorter lead bond wire connection.

In FIG. 7, the first bond pad 312 is depicted as comprising a plurality of bond pad portions where each portion is provided to couple a pair of bond wires. In some embodiments, the bond pad portions may be coupled together, for example, electrically or through a resistive coupling. In one example, the bond pad portions may be coupled resistively in an attempt to equalize the voltage potential between the adjacent bond pads portions.

It will be appreciated that the foregoing describes embodiments relating to the output impedance network of FIG. 4. It will however be appreciated that such a physical implementation of an output impedance network may be compatible with a variety of impedance networks. In the foregoing, an example implementation of the input impedance matching network 310 was given in FIG. 5. In this example, the bond wire connections 402 of the input impedance matching circuit 310 may be interleaved between the bond wire connections of the respective bond wire connection pairs.

Figure 8:
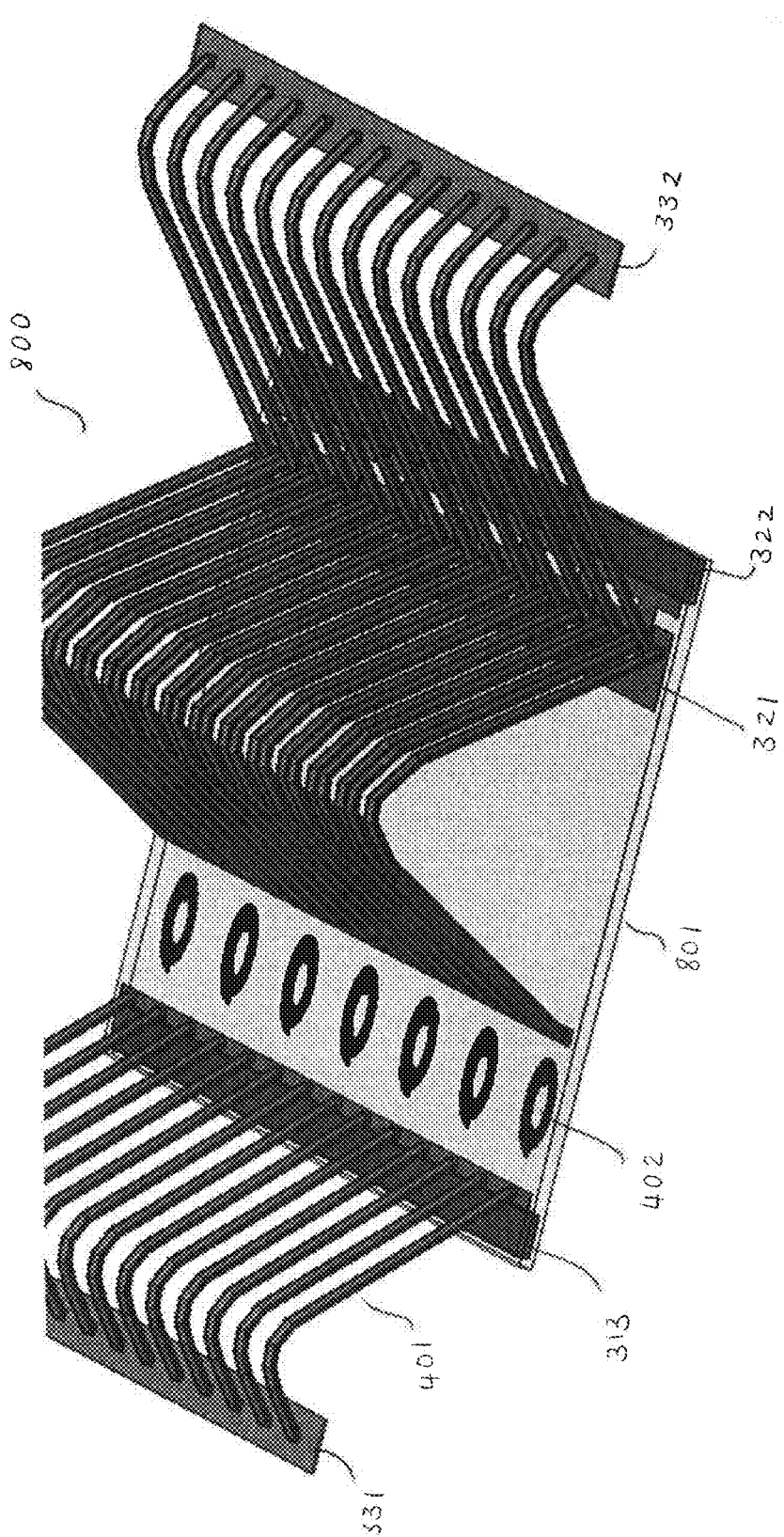
FIG. 8 shows a physical implementation of impedance matching circuitry according to a further example.

It will however be appreciated that different implementations of the input impedance matching network may be used. For example, in some cases, the pre-match capacitor 313 may be omitted and the input terminal 311 may be coupled to the input package lead 331 by bond wire connections. In another example, the inductor provided by the bond wire connections 402 may be integrated onto the die. FIG. 8 shows such an example.

The package 800 of FIG. 8 comprises a die 801, input package lead 331, and output package lead 332. The die 801 comprises an integrated pre-match capacitor 313 and an integrated inductor 402. A plurality of bond wire connections 401 are coupled between the input package lead 331 an input bond pad coupled to the integrated pre-match capacitor 313. The input bond pad 331 may also be coupled to the integrated inductor 402. The inductor 402 may be coupled to an input terminal of the on-die functional circuitry 301. This coupling may take place internally to the die.

It will be appreciated that the output impedance matching circuitry 320 may be arranged as per previous embodiments. For example, the first bond pad 312 may be positioned on the surface of the die 801 and the output terminal 321 may be arranged between the first bond pad 312 and the output package lead 332.

In this example, in addition to the effect of the pairs of bond wire connections 404, 405 forming the shunt inductor, the magnetic field of the integrated inductor 402 may be substantially perpendicular to any magnetic field of the shunt inductor 404, 405 and/or bond wire connections 401. This may adjust the coupling between these components.

It will however be appreciated that while examples of an implementation of an input impedance matching circuit are discussed, any suitable input impedance matching network may be implemented. The effect of pairs of bond wire connections of the shunt inductor 221 may be independent of the implementation of the input impedance matching circuit.

It will be appreciated that the value of inductance provided by the shunt inductor may be dependent on a variety of parameters. For example the inductance of a bond wire connection may be determined by one or more of the number, length, shape and nature of the bond wires making up each connection. For example, in some cases, it may be desired to minimize the inductance of the bond wire connections and thus the configuration of the bond wire connection will be set in an attempt to minimize the inductance provided by the bond wire connection. In other cases, the desired inductance of the bond wire connections may depend on the input and output impedance of the functional circuitry 201 on the die 200 and the configuration of the bond wire connection may be selected accordingly.

In some embodiments, the bond wire connections 404 and 405 of the shunt inductor may be adjusted to provide a desired value of inductance. For example, adjusting the shape of the loop of the bond wire connections 404 and 405 may affect the mutual inductance between the bond wire connections 404 and 405.

Figure 9:
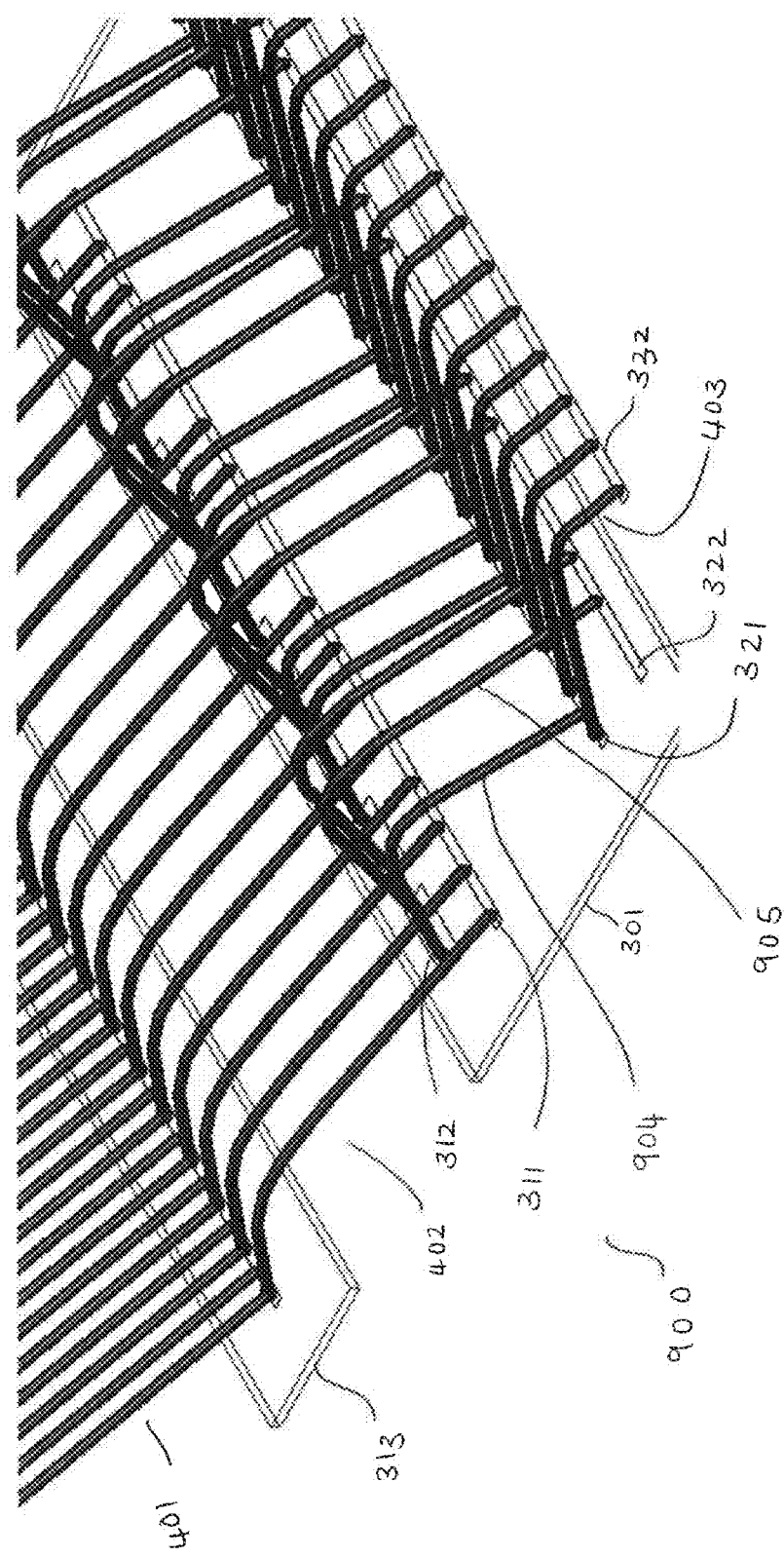
FIG. 9 shows a physical implementation of impedance matching circuitry according to a further example.

FIG. 9 gives an example of a package 900 arrangement where the mutual inductance and/or the coupling between the pairs of bond wire connections of the shunt inductor have been adjusted by changing the loop shape and/or length of each bond wire connection.

FIG. 9 shows an output package lead 332, die 301 having an input terminal 311, output terminal 321, first bond pad 312 and second bond pad 322. FIG. 9 also shows first and second bond wire connections 401 and 402 on the input impedance matching circuit side and first, second and third bond wire connections 904, 905 and 403 on the output impedance matching circuit side. It will be appreciated that like reference numerals indicate like features.

The shunt inductor of the output impedance matching circuitry comprises first bond wire connections 904 coupled between the output terminal 321 and the first bond pad 312 and second bond wire connections 905 coupled between the first bond pad 312 and the second bond pad 322.

In the example of FIG. 9, the shape of a loop formed by each bond wire connection forming part of the first bond wire connections 904 may differ from the shape of the loop formed by each bond wire connection forming part of the second bond wire connections 905. The relationship between the shape of the first bond wire connections 904 and the shape of the second bond wire connections 905 may be set to a desired or predetermined inductance and/or coupling. In addition or alternatively, the points coupling each of the first bond wire connections 404 to the output terminal 321, the points coupling each of the second bond wire connections 905 with the second bond pad 322 and the points coupling each of the third bond wire connections 403 with the output terminal 321 may be misaligned to adjust inductance and/or a coupling effect. Similarly, the points coupling each of the second bond wire connections 402 to the input terminal 311 and the points coupling each of the first and second bond wire connections 404 and 405 to the first bond pad 312 may be misaligned to tune the inductance and/or coupling effect.

It will be appreciated that FIG. 9 shows only one example of an input impedance matching circuit and any suitable input impedance matching circuitry may be used in other embodiments. It will be appreciated that the nature of the impedance matching circuit will be determined by the nature and requirements of the on-die circuitry.

Figure 10:
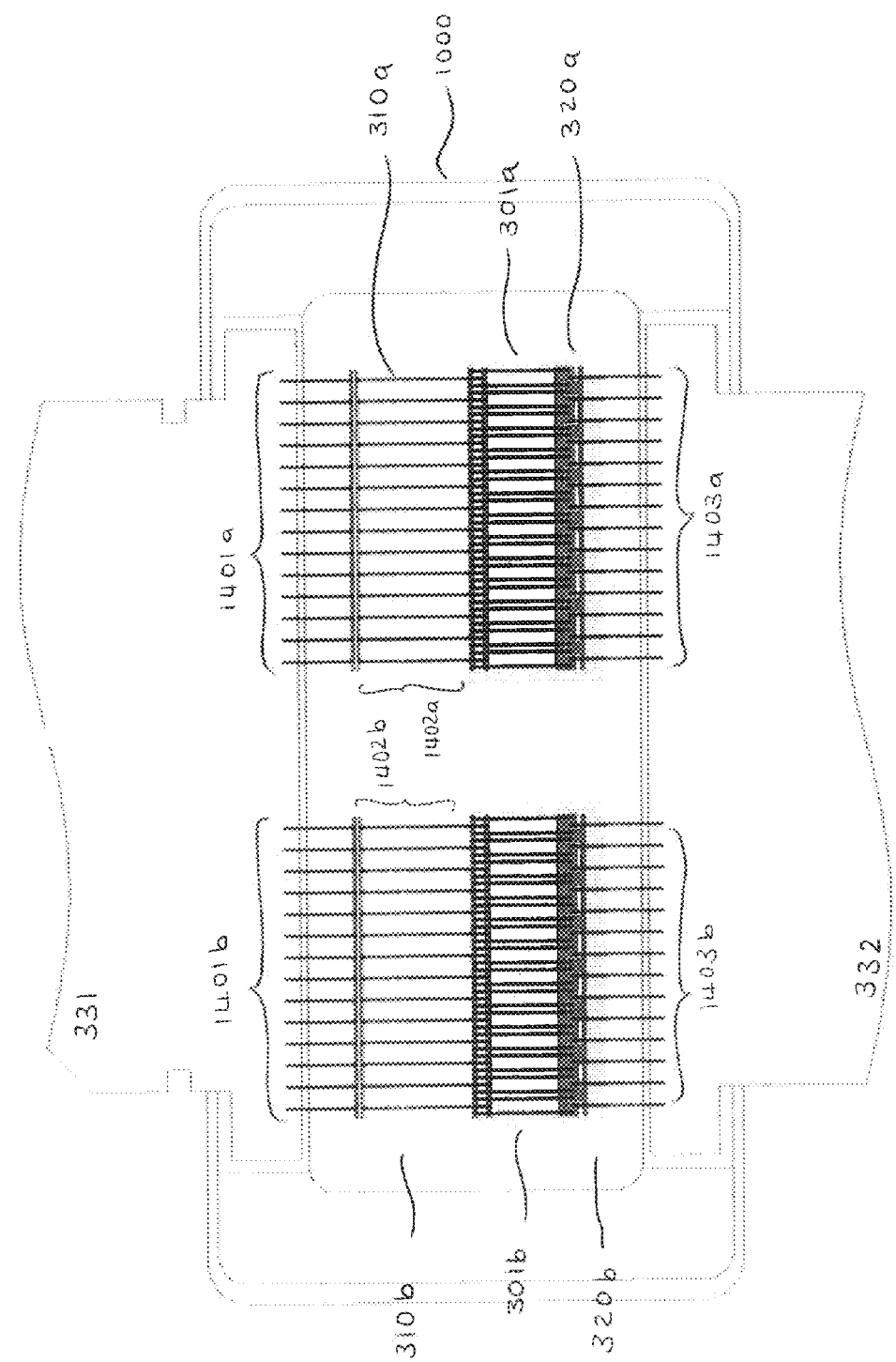
FIG. 10 shows an example of a multi-device package.

While the foregoing focuses on the implementation of an impedance matching circuit for a single functional circuit, it will be appreciated that embodiments may be scaled up to a package comprising multiple devices. An example of a two device package is shown in FIG. 10. For example, an impedance matching circuit according to embodiments may be provided for each device integrated in the package. In some examples, each of the devices may comprise a plurality of functional circuitry.

FIG. 10 shows an example of a packaged device comprising two dice with respective input and output impedance matching circuitry. The package 1000 comprises a first die 301a and a second die 301b. Each die is associated with respective input impedance matching circuitry 310a, 310b and output impedance matching circuitry 320a and 320b. The package 1000 comprises an input package lead 331 and an output package lead 332.

Bond wire connections 1403a are coupled between the output package lead 332 and the output terminal 321a of the first die 301a. Bond wire connections 1401a are coupled between the input package lead 331 and the pre-match capacitor 313 of the first die 301a. Bond wire connections 1402a are coupled between the pre-match capacitor 313 and the input terminal 311 of the first die 311a.

A shunt inductor is coupled between the output terminal 321, a first bond pad 312 and a second bond pad 322. The shunt inductor comprises first bond wire connections coupled between the output terminal 321 and the first bond pad 312 and second bond wire connections coupled between the first bond pad 312 and the second bond pad 322. The second die 301b comprises similar components.

While it will be appreciated that embodiments of the present disclosure may be applicable to a variety of on-die functional circuitry, in the foregoing a transistor circuit, for example transistor 301, has been used as an example. In this example, the output impedance matching network according to embodiments is coupled to the drain of the transistor 301 and the input impedance matching circuit is coupled to the gate of the transistor with the source coupled to ground. The input and output impedance matching circuits are designed with passive components such as the bond wires, inductors and/or capacitors to provide a desired impedance match. In the example relating to a transistor 301, this impedance match is specific to the functionality of the transistor. In specific examples, the transistor may be a radio frequency (RF) power transistor and more specifically a laterally diffused metal oxide semiconductor (LDMOS).

The foregoing refers to a first bond pad 312 coupling bond wire connections 404 and 405 to a capacitor 406 and a second bond pad 322 for coupling the first and second bond wire connections 404, 405 of the shunt inductor to a capacitor 407. It will be appreciated a bond pad refers to an area of electric conductor at least on the surface of the die that may facilitate the coupling of components integrated or otherwise. In examples, the first bond pad 312 is shaped as a strip of conductor in order to provide an area suitable for the coupling of the bond wire connections 404, 405 to the capacitor 406. It will be appreciated that the second bond pad may be shaped as a bond bar in some embodiments. The first bond pad 312 may in some embodiments be implemented as a plurality of separate bond pad portions, each to couple one of the bond wire connections 404 and one of the bond wire connections 405.

In the foregoing, the bond wires over the surface of the die have been described as being along an axis of orientation. In some cases the bond wires may deviate slightly from the axis, for example due to unintentional or undersigned for bends in the wires, however it will be appreciated that the bond wires may be substantially along the axis of orientation. The axis 340 has been exemplified in the figures as a straight line between the first terminal 311 and the second terminal 321 and is shown as perpendicular to the first and second terminals. It will however be appreciated that this is by way of example only and the axis, in some embodiments, may not be perpendicular to the terminals. For example the axis may run at an angle to the first terminal, along a straight line, to a reciprocal angle to the second terminal. The axis 340 may exemplify a line between the first terminal and the second terminal over the surface of the die.

In the foregoing the term coupled has been used to describe a relationship between a bond wire connection and a terminal, bond pad or lead. It will be appreciated that the term coupled in this context may refer to a physical and/or electrical coupling between the bond wire connection and the terminal, bond pad and/or lead. Reference has also be made in the description to a magnetic or mutual coupling, for example a mutual coupling between bond wire connections. It will be appreciated that this mutual coupling is understood to be distinct from the physical or electrical coupling.

The invention claimed is:

1. A package comprising:
an integrated circuit die having a first terminal and a second terminal;
a first package lead coupled to the first terminal;
a second package lead coupled to the second terminal; and
an impedance matching network coupled to the second terminal and comprising a first inductor and a first capacitor, wherein the first capacitor is an integrated capacitor arranged on the integrated circuit die;
wherein the first inductor comprises first bond wire connections coupled between the second terminal and a first bond pad on the die, and second bond wire connections coupled between the first bond pad and a second bond pad coupled to the first capacitor;
wherein the first bond wire connections and the second bond wire connections are adjacently arranged;
wherein the first bond pad is arranged on the die in between the first package lead and the second terminal; and
wherein the first capacitor is a DC decoupling capacitor.

2. The package of claim 1, wherein the first bond wire connections and the second bond wire connections are configured such that during operation the instantaneous currents carried by these respective connections flow in opposite directions.

3. The package of claim 1, wherein the first and second bond wire connections are over the surface of the die.

4. The package of claim 1, wherein the first and second bond wire connections are orientated substantially along an axis defined by the first terminal and the second terminal.

5. The package of claim 1, wherein the first bond pad is disposed in a first bond pad bar and wherein the second bond pad is disposed in a second bond pad bar, wherein the first terminal and the second terminal each extend along a first direction, and wherein the first bond pad bar and the second bond pad bar are arranged parallel to said first direction.

6. The package of claim 1, wherein the second bond pad is positioned on the die between the second terminal and the second package lead.

7. The package of claim 1, wherein the package further comprises third bond wire connections coupled between the second terminal and the second package lead.

8. The package of claim 7, wherein each of the first bond wire connections is associated with a respective one of the second bond wire connections forming a bond wire connection pair and the bond wire connection pair is further associated with one of the third bond wire connections.

9. The package of claim 8, wherein the second bond pad and the second terminal are arranged with respect to each other such that, for each bond wire connection pair, a point coupling the third bond wire connection to the second terminal is interleaved between a point coupling the first bond wire connection to the second terminal and a point coupling the second bond wire connection to the second bond pad.

10. The package of claim 1, where the second bond pad and the second terminal are interdigitated.

11. The package of claim 10, wherein the second terminal and second bond pad are interdigitated such that, for each bond wire connection pair, a point coupling the first bond wire connection to the second terminal is aligned with a point coupling the second bond wire connection to the second bond pad.

12. The package of claim 1, wherein the DC decoupling capacitor is coupled between the second bond pad and ground.

13. The package of claim 1, wherein a bond wire connection comprises one or more bond wires.

14. An apparatus comprising:
an integrated circuit die having an output terminal;
an output package lead coupled to the output terminal; and
an impedance matching network coupled to the output terminal and comprising a first inductor and a first capacitor, wherein the first capacitor is an integrated capacitor arranged on the integrated circuit die;
wherein the first inductor comprises first bond wire connections coupled between the output terminal and a first bond pad on the die, and second bond wire connections coupled between the first bond pad and a second bond pad coupled to the first capacitor;

wherein the first bond wire connections and the second bond wire connections are adjacently arranged; and wherein the first capacitor is a DC decoupling capacitor.

15. The apparatus of claim 14 further comprising:
the integrated circuit die having an input terminal;
an input package lead coupled to the first terminal;
wherein the first bond pad is arranged on the die in between the input package lead and the second terminal.

16. The apparatus of claim 15, where the second bond pad and the output terminal are interdigitated.

17. The apparatus of claim 16, wherein the output terminal and second bond pad are interdigitated such that, for each bond wire connection pair, a point coupling the first bond wire connection to the output terminal is aligned with a point coupling the second bond wire connection to the second bond pad.

18. The apparatus of claim 14, further comprising third bond wire connections coupled between the output terminal and the second package lead.

\* \* \* \* \*